United States Patent [19]

Bauer

[11] 4,326,010

[45] Apr. 20, 1982

[54] ADDITIVE IN A PHOTOPOLYMERIZABLE COMPOSITION FOR REDUCING ITS ADHESION TO A SUPPORT FILM

[75] Inventor: Richard D. Bauer, Towanda, Pa.

[73] Assignee: E. I. Du Pont de Nemours and Company, Wilmington, Del.

[21] Appl. No.: 49,209

[22] Filed: Jun. 15, 1979

[51] Int. Cl.³ .................... B32B 27/36; C08F 255/02
[52] U.S. Cl. .................... 428/483; 204/159.16; 204/159.19; 427/44; 427/53.1; 427/54.1; 428/40; 428/480; 428/522
[58] Field of Search ............ 428/483, 40, 522, 480; 204/159.16, 159.19; 427/53.1, 54.1, 44

[56] References Cited

U.S. PATENT DOCUMENTS

| | | | |
|---|---|---|---|
| 3,469,982 | 9/1969 | Celeste | 96/36.3 |
| 3,649,268 | 3/1972 | Chu | 96/36.2 |
| 3,661,618 | 5/1972 | Brookman | 428/40 |
| 3,854,950 | 12/1974 | Held | 96/15 |
| 3,912,516 | 10/1975 | Recchia | 204/159.19 |
| 3,951,657 | 4/1976 | Recchia | 204/159.19 |
| 3,958,065 | 5/1976 | Ranck | 428/483 |
| 3,989,609 | 11/1976 | Brack | 428/423 |
| 3,993,815 | 11/1976 | Douek | 428/483 |
| 4,054,483 | 10/1977 | Peiffer | 96/38.4 |
| 4,076,766 | 2/1978 | Simms | 428/483 |
| 4,104,066 | 8/1978 | Williams | 427/19 |

FOREIGN PATENT DOCUMENTS 1499623 2/1978 United Kingdom .

OTHER PUBLICATIONS

"New Polycaprolactone Thermoplastic Polymers PCL 300 and PCL 700", Union Carbide F42501, *New Prdt Information*, 4/69.

*Primary Examiner*—Ellis P. Robinson

[57] ABSTRACT

Polyesters such as polycaprolactone have been found to be useful as an additive in photopolymerizable compositions for reducing adhesion to a support film.

14 Claims, No Drawings

ADDITIVE IN A PHOTOPOLYMERIZABLE COMPOSITION FOR REDUCING ITS ADHESION TO A SUPPORT FILM

TECHNICAL FIELD

This invention relates to photopolymerizable compositions and more particularly to an additive for reducing the adhesion of the composition to a support film.

BACKGROUND ART

Photopolymerizable elements of a photopolymerizable layer sandwiched between a support film and a cover film such as disclosed in U.S. Pat. No. 3,469,982 have achieved widespread usage in the process for making a printed circuit as described in that patent. A preliminary step in this process is to remove the cover film from the element and then to laminate the exposed surface of the photopolymerizable layer to the surface, usually of copper, of a substrate. The support film has sufficient adhesion to the layer that removal of the cover film does not cause the layer to detach from the support film. Sometime after the lamination step, either before or after the step of imagewise exposure of the photopolymerizable layer, but prior to the solvent development step, the support film has to be stripped away from the photopolymerizable layer. At this time, it is desired that the adhesion between the layer and support film not be so high that this stripping causes the layer to detach from the substrate surface and/or lessen the possibility of the support sheet tearing.

In a related phenomenon, the force required to peel the support film from the laminated layer may oscillate widely between a maximum and minimum value as the support is removed to give a characteristic audible sound analogous to the functioning of a zipper. When the difference between the maximum and minimum value is large, detachment of the layer from the substrate surface is more likely to occur.

While this delicate balance of adhesion has been admirably achieved, there nevertheless has existed a need to render the balance less delicate, so that the photopolymerizable element has a wide, reliable processing latitude to accommodate the different cleaning (of the substrate surface), lamination, and stripping conditions practiced by the many users of the element without introducing unwanted deleterious effects during etching or plating.

Other photopolymerizable elements having a similar sandwich structure, such as disclosed in U.S. Pat. No. 3,649,268, have achieved widespread usage in the process of making 4 color surprint proofs directly from contact transparencies to be used in preparing printing plates. In this process, a cover film is removed from a tacky photopolymerizable layer which is then laminated to a white cardboard substrate. The laminated element is exposed to actinic radiation through one of the contact transparencies to produce nontacky exposed image areas and the superposed support film is then removed. Suitable particulate toner is applied to the imaged surface to form an accurate positive copy of the original transparency. Using the previously toned image as a substrate and by repeating several times the lamination, exposure in register, and toning steps with suitable transparencies and toners, a multicolored surprint is formed. In this process a problem known as "pick-off" can occur during the removal of the support film from the exposed laminated element when the support film's adhesion to unexposed photopolymer is too high. In this instance, the unexposed area over a previously toned image area directly below is pulled up with some of the underlying toned surface as the support film is removed. While the balance of adhesion and cohesion has been achieved to reduce the pick-off problem, there nevertheless has existed a need to render the balance less delicate, so that the photopolymerizable element has a wide, reliable processing latitude without unduly increasing support adhesion.

DISCLOSURE OF INVENTION

The present invention satisfies this need by the discovery that a small amount of polyester incorporated into the photopolymerizable composition reduces its adhesion to the support film without adversely affecting the utility of the photoresist element. Up to 4% of the total weight of the composition is all of the polyester adhesion-reducing agent that is necessary.

DETAILED DISCLOSURE AND BEST MODE

The polyester adhesion-reducing agent contains the unit

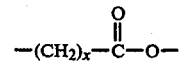

wherein x is from 2 to 8. A class of the agent includes the polyesters of hydroxycarboxylic acids and lactones thereof in which the aforesaid unit is the repeat unit of the polyester. Another class of the agent includes the polyesters of a dicarboxylic acid and a diol and has the repeat unit

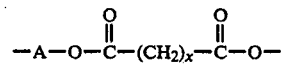

wherein x has the same meaning as above and A is a linear or branched alkylene group containing 2 to 8 carbon atoms.

Representative polyester adhesion-reducing agents useful in the present invention are the aliphatic polyesters with a molecular weight between about 1500 and 40,000 such as polycaprolactone, which is preferred for reasons of economic availability, poly(ethylene adipate), poly(butylene adipate), poly(2,2-dimethyl-3-propylene-succinate), and poly(hexamethylene sebacate).

The polyester adhesion-reducing agent is incorporated into the photopolymerizable composition at the time the latter is compounded, usually in solution, prior to applying the composition to the support film to form a laminate of a layer of the composition on the film support. This layer may be the sole layer of photopolymerizable composition or one or more additional layers may be present. In the latter case, the layer in contact with the support film is the layer containing the polyester adhesion-reducing agent.

The proportion of polyester adhesion-reducing agent in the composition will depend on the particular agent used, the particular photopolymerizable composition used, especially the binder component thereof, and the level of adhesion reduction desired. Generally, from 0.1 to 3% of the agent based on the weight of the composition will suffice, with the exact proportion selected being effective to produce adhesion reduction.

The effectiveness of a particular polyester adhesion-reducing agent may also be molecular weight and temperature dependent. For example, for a particular photopolymerizable composition polycaprolactone of average molecular weight of 15,000 is more effective than polycaprolactone of average molecular weight 40,000.

Adhesion between a photopolymerizable layer and its support film normally increases with heating such as at least at 60° C., making it more difficult to remove the support film at elevated temperatures. Poly(butylene adipate), however, as the agent present in the photopolymerizable layer reverses this effect. While this agent is only moderately effective in reducing adhesion at room temperature, heating of the laminate produces a much greater adhesion reducing effect.

In addition to increasing the processing latitude of photoresist elements, use of the polyester adhesion-reducing agent provides the additional benefit that photopolymerizable compositions having good properties for photoresist utility, except for high adhesion to the support film, can now be used.

The photopolymerizable composition into which the polyester adhesion-reducing additive is incorporated, and the support film are conventional components such as those disclosed in U.S. Pat. Nos. 4,054,483, 3,854,950 and the aforementioned U.S. Pat. No. 3,649,268 and U.S. Pat. No. 3,469,982.

The photopolymerizable composition generally comprises binder, monomer, and photoinitiator each of which may be a single ingredient or a plurality thereof to accomplish the intended function. Typically, the binder will be acrylic polymer in which at least 40% of the weight of the binder is of units derived from acrylic monomer, i.e., acrylic acid, methacrylic acid, and esters and nitriles thereof. The polymer can be derived from a single monomer such as poly(methyl methacrylate) or from a plurality of monomers, e.g., methyl methacrylate/methacrylic acid copolymer, methyl methacrylate/ethyl acrylate/acrylic acid copolymer, and methyl methacrylate/acrylonitrile-butadiene-styrene copolymer. Other nonacrylic polymers may be present such as styrene/maleic anhydride copolymer. Typical monomers are the polyfunctional acrylates such as trimethylolpropane dimethacrylate, ethylene glycol diacrylate, diethylene glycol diacrylate, pentaerythritol triacrylate, and tetraethylene glycol dimethacrylate. Generally, monomers will contain small amounts of thermal polymerization inhibitors. Typical photoinitiators are those active in the ultraviolet radiation region such as Michler's ketone and benzophenone, preferably in combination and hexaryl bis imidazoles and leuco dyes. Typically the composition will comprise 40 to 70% by weight of binder, 10 to 40% by weight of monomer, and 0.5 to 15% by weight of photoinitiator to total 100% based on the weight of all these components. Additional binder, monomer, and photoinitiator components that can be used in the present invention are those disclosed in U.S. Pat. No. 4,054,483.

Although the invention is useful with a wide variety of support films such as described in U.S. Pat. No. 4,054,483 the usual support film used in commercial photoresist elements is polyethylene terephthalate and that is the preferred support film available as Mylar ® polyester film for use in the present invention. The cover film is preferably polyethylene.

The adhesion of the support film to the photopolymerizable layer and thus the adhesion reduction achieved by the present invention can be determined by the following test procedure:

A photopolymerizable element comprising a support film, a photopolymerizable layer and optionally a cover film is cut into 2.54 cm wide strips. The cover film, if present, is removed and the photopolymerizable layer is laminated to a substrate. The peel force required to remove the support film from the laminated photopolymerizable layer is measured using an Instron ® Model 1130 Universal Testing Instrument and is expressed in grams/centimeter. The direction of peel is back across and parallel to the top surface of the laminated support, i.e., about 180° from the leading edge of the support film. A single procedure for determining the optimum concentration of additive, consists in measuring peel forces for elements which differ only in additive concentration and plotting or comparing peel force versus concentration and identifying the concentration producing minimum peel force. Similarly, to determine the optimum temperature for removing the support, a family of concentration versus peel force plots are determined over the temperature range of interest.

Examples of the present invention are as follows:

EXAMPLE 1

The effect of polycaprolactone in a photoresist film element is demonstrated.

A stock solution is prepared by adding the following ingredients to 2300 grams of methylene chloride

|  | Grams |
|---|---|
| copolymer of methyl methacrylate (46%), acrylonitrile (9%), butadiene (14%), and styrene (31%) | 225 |
| Poly(methyl methacrylate), inh vis 1.38 | 90 |
| methyl methacrylate (96%)/ethylacrylate (4%) copolymer, inh vis 0.54 | 97.5 |
| Tetraethylene glycol diacrylate | 133.5 |
| Trimethylolpropane triacrylate | 133.5 |
| 2,2'-Bis(2-chlorophenyl)-4,4',5,5'-tetraphenyl biimidazole | 7.5 |
| Michler's ketone | 0.9 |
| Benzophenone | 45 |
| Benzotriazole | 1.5 |
| Victoria Green (CI Pigment Green 18) | 0.2 |
| p-Toluene sulfonic acid | 0.37 |
| Leuco Crystal Violet | 0.75 |

To each of seven 100 grams aliquots of the stock solution is added the amount of polycaprolactone (molecular wt. 15,000) shown in Table 1. The difference between 0.5 grams and the weight of polycaprolactone is made up with the same methylmethacrylate/ethylacrylate copolymer in the stock solution. The total polymer weight in each coating solution is then constant.

TABLE 1

| Coating Solution | Wt (gms) Polycaprolactone | Support Film Peel Force (g/cm) |
|---|---|---|
| A | 0 | 115 |
| B | 0.013 | 78 |
| C | 0.025 | 50 |
| D | 0.06 | 22 |
| E | 0.13 | 45 |
| F | 0.25 | 85 |
| G | 0.5 | 98 |

Each of the solutions is coated on a 0.025 mm polyethylene terephthalate film support and dried to give a photopolymerizable layer thickness of about 0.025 mm. The photopolymerizable layer is then laminated to the cleaned copper surface of a copper-clad glass epoxy board using a Riston ® Model HRL-24 Hot Roll Laminator at 104° C. The peel force is measured at room temperature as described above to give the values in Table 1. The coating from solution D with 0.06 gms (0.25%) polycaprolactone has the lowest peel force value which is an 80% reduction from the coating prepared from solution A containing no polycaprolactone.

Two samples of the coating from solution A containing no polycaprolactone and two from solution D containing 0.06 gm polycaprolactone are laminated to cleaned copper-clad epoxy boards and imagewise exposed. The polyethylene terephthalate support sheets are removed and the unexposed resist areas removed in a methyl chloroform spray to leave a test circuit pattern on the copper surface. One board of each coating is passed through a spray etcher (130° F. FeCl$_3$/HCl etchant, 42° Be') to remove the copper not covered by resist. An examination of both panels after etching shows that neither one suffers a breakdown of resist adhesion due to the hot etchant. The other patterned board of each coating is dipped into a hot detergent solution and then a solution of ammonium persulfate to clean the copper not covered by resist. These panels are then copper plated in a copper sulfate plating bath for 20 minutes at a current density of 3.2 amperes per square decimeter. This is followed by solder plating in a tin-lead bath for 10 minutes at 1.6 ampere per square decimeter. An examination of both panels after the plating cycle reveals no breakdown of resist adhesion. Consequently, the presence of 0.06 gm (0.25% by wt.) of polycaprolactone in the resist substantially improves support sheet removal without adversely affecting either the resist plating or etching characteristics.

EXAMPLE 2

The effect of polycaprolactone to reduce peel force and "zippering" is demonstrated on a similar photopolymer composition.

A stock solution of the composition is prepared by adding methylene chloride to the composition whereby it amounts to 24.2% of the solution.

To individual aliquots of stock solution is added the amount of polycaprolactone (MW 15,000) shown in Table 2. The amounts are expressed as a weight percent of the dried photopolymer coating. The final total weight of polymer in each coating solution is constant.

TABLE 2

| Coating Solution | Wt % Polycaprolactone | Average Peel Force (g/cm) | Magnitude of Zippering (g/cm) |
|---|---|---|---|
| A | 0 | 4.7 | ±2.4 |
| B | 0.05 | 4.0 | ±2.4 |
| C | 0.1 | 3.5 | ±2.0 |
| D | 0.26 | 1.9 | ±0.6 |
| E | 0.52 | 1.4 | ±0.4 |
| F | 1.0 | 1.4 | ±0.4 |
| G | 2.1 | 2.2 | ±0.9 |
| H | 3.1 | 2.4 | ±0.8 |
| I | 5.2 | 2.4 | ±0.8 |

Each of the solutions is coated on a 0.025 mm polyethylene terephthalate film support and dried to give a photopolymerizable layer thickness of about 0.025 mm. The photopolymerizable layer is laminated to a copper-clad substrate and the support film peel force is measured as described in Example 1. Peel force oscillated between maximum and minimum values ("zippering") and the average value for peel force is given for each concentration along with the magnitude of the oscillation or "zippering" in Table 2. A minimum in peel force is observed with the use of 1% by weight of polycaprolactone with a reduction in peel force of 71% over the sample with no polycaprolactone. At the minimum peel force, a minimum in the magnitude of zippering is also observed.

EXAMPLE 3

The effect of molecular weight and chemical composition of the additive and elevated peel temperature is demonstrated.

To individual aliquots of the stock solution of Example 2 is added the amount of release additive shown in Table 3. The amounts are expressed as a weight percent of the dried photopolymer coating. The total polymer weight in each solution is the same. Each solution is coated, dried and laminated as described in Example 1. The support film peel force is measured as in Example 2 except that for the elevated temperature measurements each sample is warmed by passing it between two heated rolls at 104° C. immediately before the peel force measurement.

Comparison of the peel force measurements in Table 3 demonstrates that other polyester additives (Sample D and E) showed release properties similar to polycaprolactone (Sample B and C).

TABLE 3

| | | Room Temperature | | Warming | |
|---|---|---|---|---|---|
| Sample | Additive | Average Peel Force (g/cm) | Magnitude of Zippering (g/cm) | Average Peel Force (g/cm) | Magnitude of Zippering (g/cm) |
| A | 0 grams | 4.7 | ±2.1 | 7.9 | ±4.3 |
| B | 2.1 wt % polycaprolactone MW = 15,000 | 2.8 | ±1.2 | 1.2 | no zippering |
| C | 2.1 wt % polycaprolactone MW = 25,000 | 3.9 | ±1.6 | 3.1 | ±0.8 |
| D | 2.1 wt % poly(ethyleneadipate) | 2.0 | ±0.8 | 1.6 | ±0.8 |
| E | 2.1 wt % poly(butyleneadipate | 3.9 | ±2.0 | 1.6 | no zippering |

As demonstrated in Table 3, when no additive is present in the coating (Sample A) both peel force and the magnitude of zippering is increased when the sample is warmed. In contrast, both peel force and the magnitude of zippering is reduced when samples containing the additive are warmed. As demonstrated by Samples B and C, when molecular weight of the same polyester additive is decreased, the effectiveness in reducing peel force and zippering is increased.

EXAMPLE 4

The effect of molecular weight and chemical composition of the additive on the support film adhesion is demonstrated.

To individual aliquots of coating solution like that in Example 2 is added 2.1 weight % of additive given in Table 4. No additive is in the first sample but the total binder content of each coating solution is maintained constant. Each solution is coated, dried and laminated as described in Example 1 and the support film peel force is measured as in Example 2 to give the values in Table 4.

TABLE 4

| Sample | Additive | Average Peel Force (g/cm) | Magnitude of Zippering (g/cm) |
|---|---|---|---|
| A | None | 11.8 | ±5.9 |
| B | Polycaprolactone (MW 15,000) | 5.9 | ±3.1 |
| C | Polycaprolactone diol (MW 3,000) | 5.5 | ±2.8 |
| D | Poly(2,2-dimethyl-3-propylene succinate) | 6.3 | ±2.8 |
| E | Poly(hexamethylene sebacate) | 7.1 | ±3.9 |

Comparison of peel force measurements in Table 4 demonstrates that other polyester additives (Samples C, D, and E) showed release properties similar to polycaprolactone (Sample B) when compared to a control value with no additive (Sample A).

EXAMPLE 5

The use of polycaprolactone in a toning film element useful in the process of U.S. Pat. No. 3,649,268 is demonstrated.

A photopolymer coating solution is prepared by adding the following ingredients to 600 grams of methylene chloride:

| | Grams |
|---|---|
| Poly(vinyl butyral) resin, MW 50,000 | 56 |
| Poly(vinyl formal) resin, MW 13,000 | 14 |
| Trimethylolpropane trimethacrylate | 68 |
| 2,2'-Bis(2-chlorophenyl)-4,4',5,5'-tetraphenyl biimidazole | 2.4 |
| 2(Stilbyl-4")-(naphtho-1',2':4,5)-1,2,3-triazole-2" sulfonic acid phenyl ester | 0.32 |
| 2,5-Bis[5'-t-butyl benzoxazole-2'yl]-thiophene | 0.8 |
| 2-Mercapto benzoxazole | 1.2 |
| 2,2'-Dihydroxy-4-methoxybenzophenone | 0.12 |
| Hydroquinone | 0.08 |

This solution is divided into two equal portions and 0.5 grams of polycaprolactone (MW 15,000) is dissolved in one of the portions. Both portions are coated on 0.025 mm polyethylene terephthalate film supports and dried under infrared heaters to give dry coating thicknesses of about 0.008 mm. The photopolymer surface of samples of both coatings are laminated to white cardboard stock using a hot roll laminator at 113° C. roll temperature and the peel force of removal of the polyethylene terephthalate film support is measured at room temperature as described above. The sample containing no polycaprolactone had a peel force of 8.6 grams/cm in contrast to the substantially reduced peel force of 3.9 grams/cm measured for the sample containing polycaprolactone.

Another similarly laminated sample of each coating is imagewise exposed through a phototool with a pattern which readily allows any pick-off to be demonstrated. After support film removal, both imaged photopolymer surfaces are toned with pigment particles of the type disclosed in U.S. Pat. No. 3,620,726 to give toned, unexposed image areas on each imaged layer. A second layer of each respective coating is similarly laminated over the first and is similarly imagewise exposed, leaving unexposed areas of the second layer over toned areas of the first layer. When the polyethylene terephthalate support films are removed the sample containing polycaprolactone is estimated to have 33% less pick-off.

A third similarly laminated sample of each coating is imagewise exposed, the polyethylene terephthalate film support removed, and the imaged layer toned with a cyan colored toner of the type disclosed in U.S. Pat. No. 3,620,726. The unexposed image areas of both samples accepts toner to give uniformly colored areas of equal reflective density indicating the absence of any detrimental effect of the polycaprolactone to the imaging and toning process.

In the foregoing Examples, parts and percents are by weight unless otherwise indicated. Inherent viscosity is measured using a solution of 0.25 g of polymer in 50 ml of chloroform at 20° C. using a Canon-Fenske Viscometer.

The polyester adhesion reducing agent in the amount present in the composition is believed to be incompatible in the composition whereby the agent concentrates at the support film interface so as to give the adhesion reduction effect.

As many apparently widely different embodiments of this invention may be made without departing from the spirit and scope thereof, it is to be understood that this invention is not limited to the specific embodiments thereof except as defined in the appended claims.

I claim:

1. A method for reducing the adhesion between a support film and a photopolymerizable composition comprising polymeric binder, monomer and photoinitiator by incorporating into said composition an effective amount up to 4% based on the weight of the composition of an aliphatic polyester adhesion reducing agent selected from the group consisting of polyesters of hydroxy monocarboxylic acids or lactones thereof, and polyesters of dicarboxylic acids and diols, having an average molecular weight of 1500 to 40,000.

2. The method of claim 1 in which the polyester contains the repeating unit

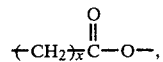

wherein x is 2 to 8.

3. The method of claim 1 in which the polyester contains the repeating unit

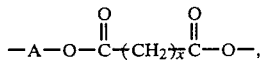

wherein x is 2 to 8 and A is a linear or branched alkylene group containing 2 to 8 carbon atoms.

4. The method of claim 1 in which the effective amount of polyester is from 0.1 to 3% by weight of the composition.

5. The method of claim 1 in which the polyester is polycaprolactone.

6. The method of claim 1 in which the binder is an acrylic polymer.

7. A photopolymerizable composition comprising polymeric binder, monomer, photoinitiator and an effective amount up to 4% based on the weight of the composition of an aliphatic polyester adhesion reducing agent selected from the group consisting of polyesters of hydroxy monocarboxylic acids, or lactones thereof and polyesters of dicarboxylic acids and diols, having an average molecular weight of 1500 to 40,000.

8. The composition of claim 7 in which the polyester contains the repeating unit

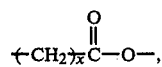

wherein x is 2 to 8.

9. The composition of claim 7 in which the polyester contains the repeating unit

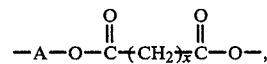

wherein x is 2 to 8 and A is a linear or branched alkylene group containing 2 to 8 carbon atoms.

10. The composition of claim 7 in which the effective amount of polyester is from 0.1 to 3% by weight of the composition.

11. The composition of claim 7 in which the polyester is polycaprolactone.

12. The composition of claim 7 in which the binder is an acrylic polymer.

13. A photopolymerizable element comprising a layer of the composition of claim 7 on a support film.

14. The photopolymerizable element of claim 13 in which the support film is poly(ethylene terephthalate).

* * * * *